(12) United States Patent
Fu et al.

(10) Patent No.: US 8,646,195 B2
(45) Date of Patent: Feb. 11, 2014

(54) FRONT PANEL ASSEMBLY WITH IDENTIFICATION PLATE

(75) Inventors: Li-Ren Fu, Shenzhen (CN); Zheng-Heng Sun, New Taipei (TW)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/570,265

(22) Filed: Aug. 9, 2012

(65) Prior Publication Data
US 2014/0007475 A1   Jan. 9, 2014

(51) Int. Cl.
*G09F 7/06* (2006.01)
(52) U.S. Cl.
USPC ............. 40/584; 40/618; 40/299.01; 361/600
(58) Field of Classification Search
USPC .............. 361/600; 24/458, DIG. 41, DIG. 43, 24/DIG. 49, DIG. 53, DIG. 60, 663, 664, 24/683; 403/348, 350, 98; 40/618, 591, 40/661.11
See application file for complete search history.

(56) References Cited

U.S. PATENT DOCUMENTS 7,475,506 B2 *  1/2009  Hernandez et al. ........ 40/661.11
8,051,592 B2 * 11/2011  Chang ........................ 40/661.11

* cited by examiner

*Primary Examiner* — Casandra Davis
(74) *Attorney, Agent, or Firm* — Altis Law Group, Inc.

(57) ABSTRACT

A front panel assembly includes a front panel, and an identification plate. The front panel defines two arc-shaped slots and a through hole. The through hole includes a positioning area, first and second extension areas extending from the positioning area along perpendicular directions, and a transition area between the first and second extension areas. The identification plate includes a main body with a logo marked on a front side, and two engagement tabs and a cam protruding from a back side of the identification plate. The engagement tabs slidably engage in the corresponding slots. The cam includes a rotation portion received in the positioning area of the through hole, and a locking portion extending from the rotation portion to move between the first extension area, the second extension area, and the transition area of the through hole, with the identification plate rotating relative to the front panel.

5 Claims, 6 Drawing Sheets

FRONT PANEL ASSEMBLY WITH IDENTIFICATION PLATE

BACKGROUND

1. Technical Field

The present disclosure relates to front panels for electronic products, and particularly to a front panel with an identification plate.

2. Description of Related Art

Referring to FIG. 6, a front panel 100 of the computer may include an identification plate 102, which is marked with a logo 103 in a fixed orientation. However, because of the fixed orientation, if the computer is rotated, such as being laid on its side to better fit on a desk, the logo may become unrecognizable or unattractive, which is not desirable for brand management.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
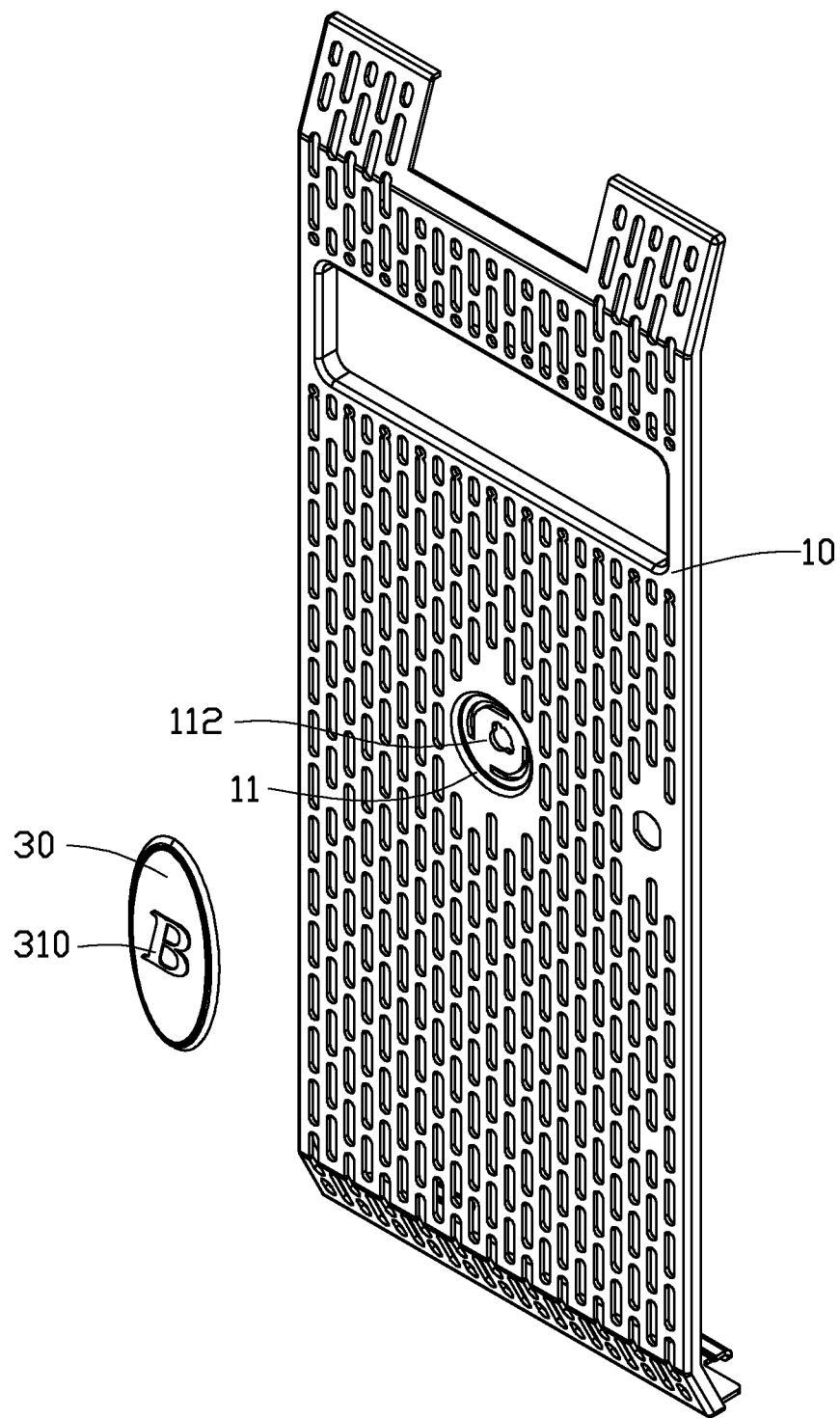
FIG. 1 is an isometric, exploded view of an exemplary embodiment of a front panel assembly, which includes a front panel and an identification plate.
Figure 2:
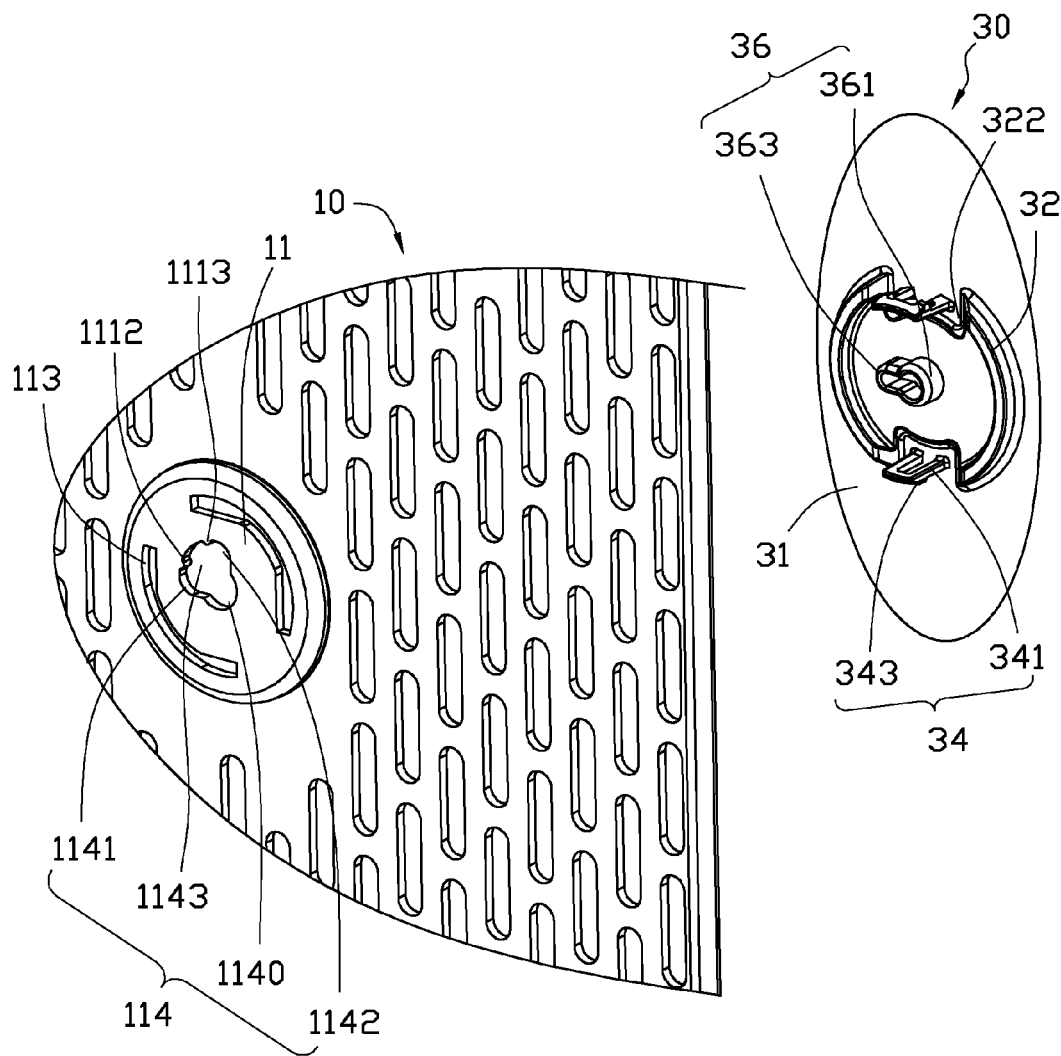
FIG. 2 is a partially enlarged view of FIG. 1, but viewed from another perspective.

Referring to FIGS. 1 and 2, an exemplary embodiment of a front panel assembly for an electronic product, such as a computer is shown. The electronic product includes a front panel 10 and an identification plate 30.

The front panel 10 defines a round recess 11 in a front side. Two arc-shaped slots 113, which are concentric with and opposite to each other, are defined in a bottom of the recess 11. A through hole 114 is defined in the recess 11. The through hole 114 includes a positioning area 1140 arranged in a center of the recess 11. The through hole 114 is concentric with the slots 113. A first and a second extension areas 1141 and 1142 extend from the positioning area 1140 along perpendicular directions. A transition area 1143 between the first and second extension areas 1141 and 1142 communicate with the positioning area 1140, the first extension area 1141, and the second extension area 1142. A first blocking bulge 1112 and a second blocking bulge 1113 protrude from an inner wall bounding the through hole 114. The first blocking bulge 1112 is arranged at a joint of the first extension area 1141 and the transition area 143. The second blocking bulge 1113 is arranged at a joint of the second extension area 1142 and the transition area 143.

The identification plate 30 includes a round main body 31, and an annular guiding block 32, two engagement tabs 34, and a cam 36 all protruding from a back side of the main body 31. A logo 310 is attached to a front side of the main body 31. Two opposite gaps 322 are defined in the guiding block 32 to equally divide the annular guiding block 32 in two segments. The engagement tabs 34 are correspondingly received in the gaps of the guiding block 32. Each of the engagement tabs 34 includes a resilient piece 341 extending from the main body 31, and a wedge-shaped tooth 343 protruding from an outside of the resilient piece 341 and adjacent to a distal end of the resilient piece 341. The cam 36 includes a rotation portion 361 arranged at a center of the main body 31, and a locking portion 363 extending from a side of the rotation portion 361.

Figure 3:
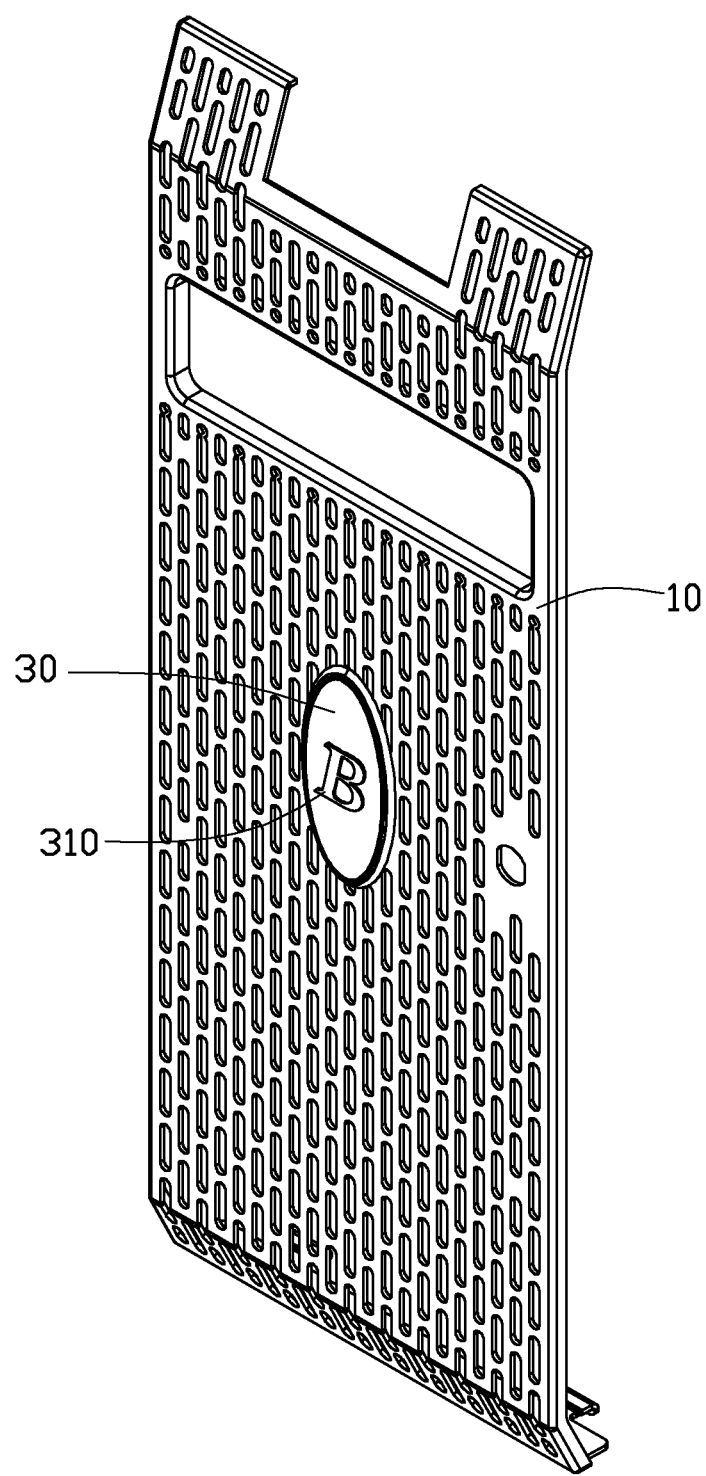
FIG. 3 is an assembled, isometric view of FIG. 1.
Figure 4:
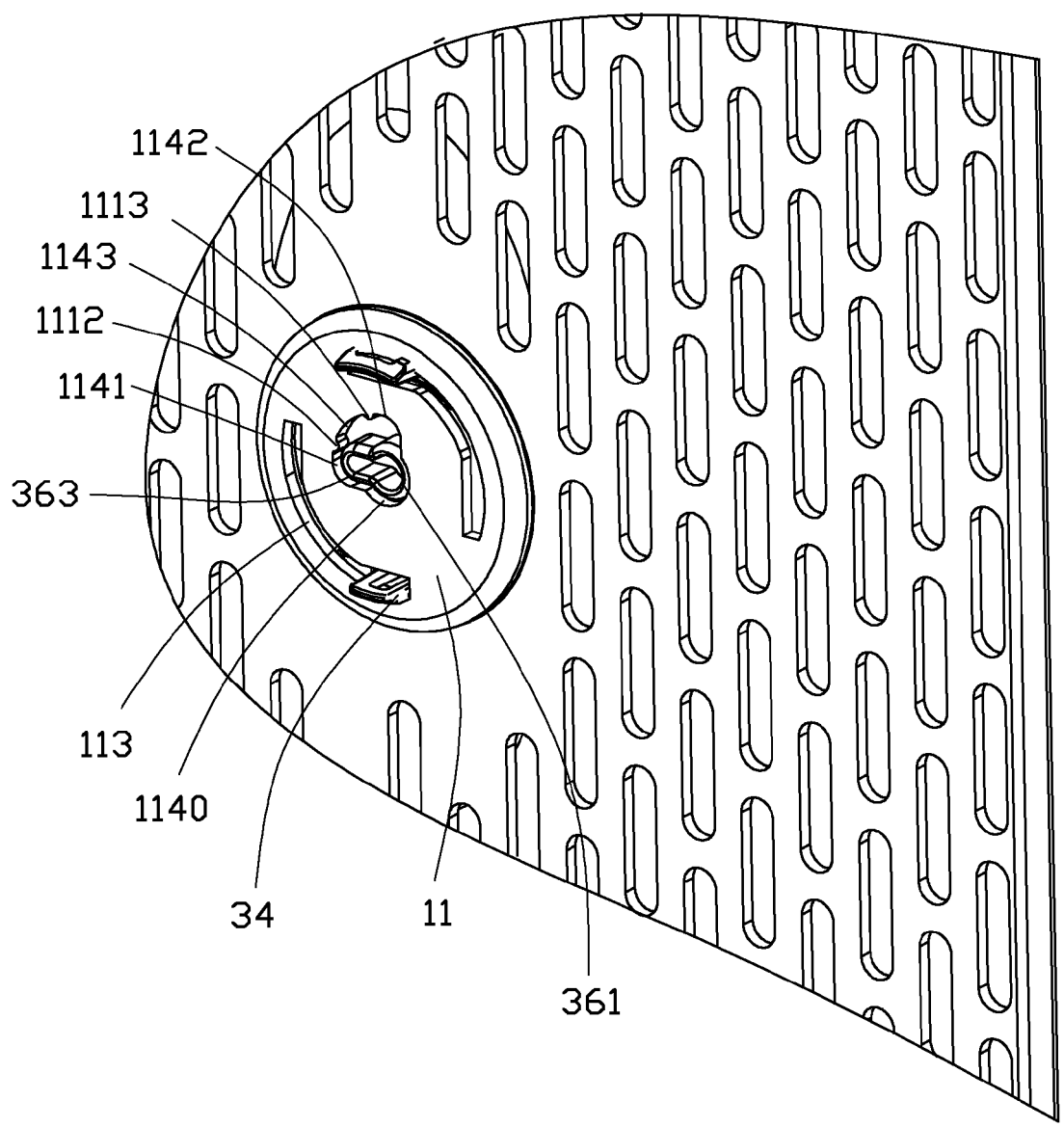
FIG. 4 is a partially enlarged view of FIG. 3, but viewed from another perspective.

FIGS. 3 and 4 show that in assembly, the identification plate 30 is accommodated in the recess 11 of the front panel 10, with the guiding block 32 abutting an inner side of the recess 11. The engagement tabs 34 slidably engaging in the slots 113 to prevent the identification plate 30 from inadvertently disengaging from the front panel 10. The cam 36 extends through the through hole 114, with the rotation portion 361 rotatably received in the positioning area 1140, and the locking portion 363 movable between the first extension area 1141, the transition area 1143, and the second extension area 1142 with the rotation of the identification plate 30 relative to the front panel 10.

When the front panel 10 stands up, the identification plate 30 is rotated to fit the locking portion 363 of the cam 36 in the first extension area 1141, thereby making the logo 310 remain upright on the front panel 10. The first blocking bulge 1112 abuts the locking portion 363 to prevent the locking portion 363 from inadvertently moving away from the first extension area 1141 to place the logo 310 askew.

Figure 5:
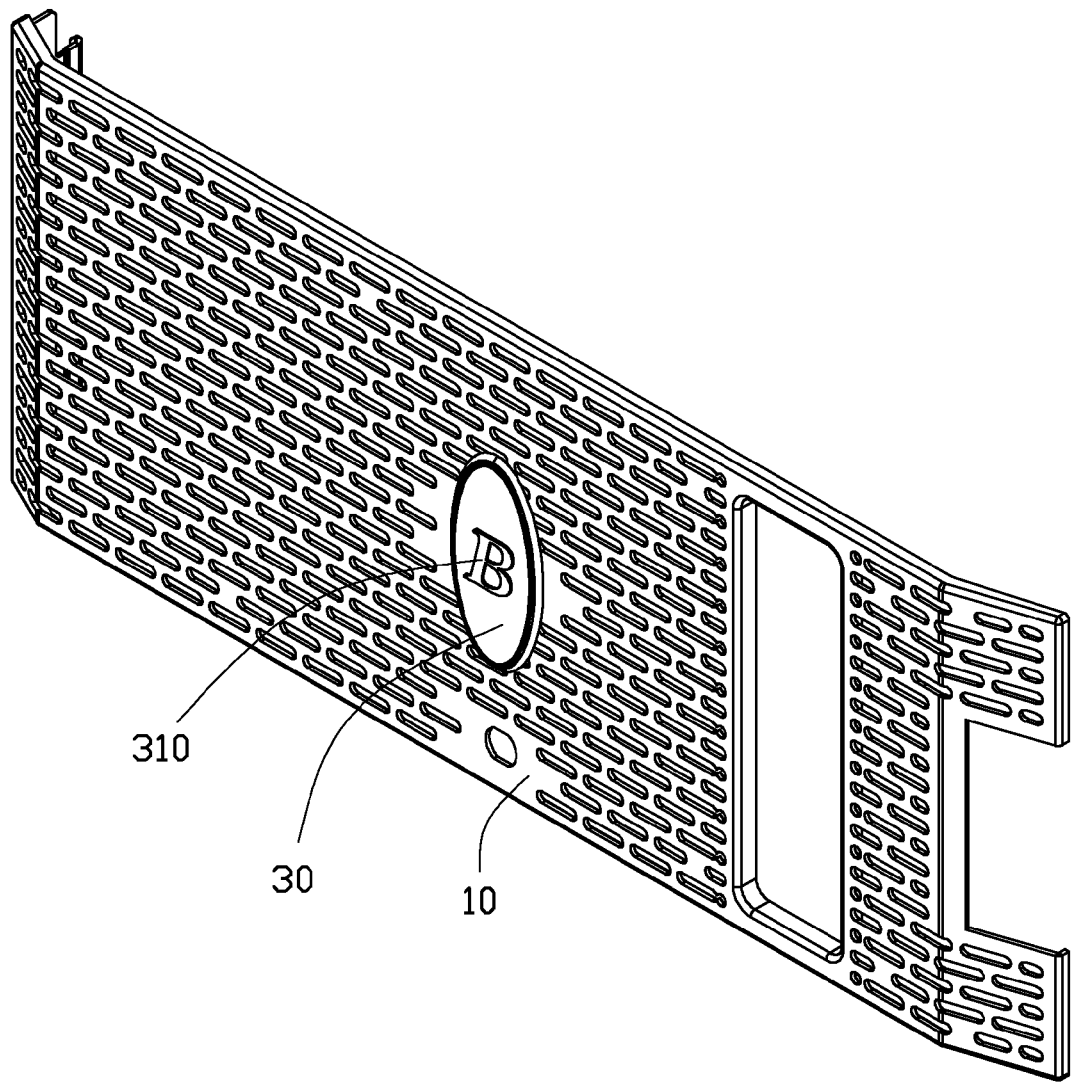
FIG. 5 is another assembled, isometric view of FIG. 1, but showing another using state different from FIG. 3.
Figure 6:
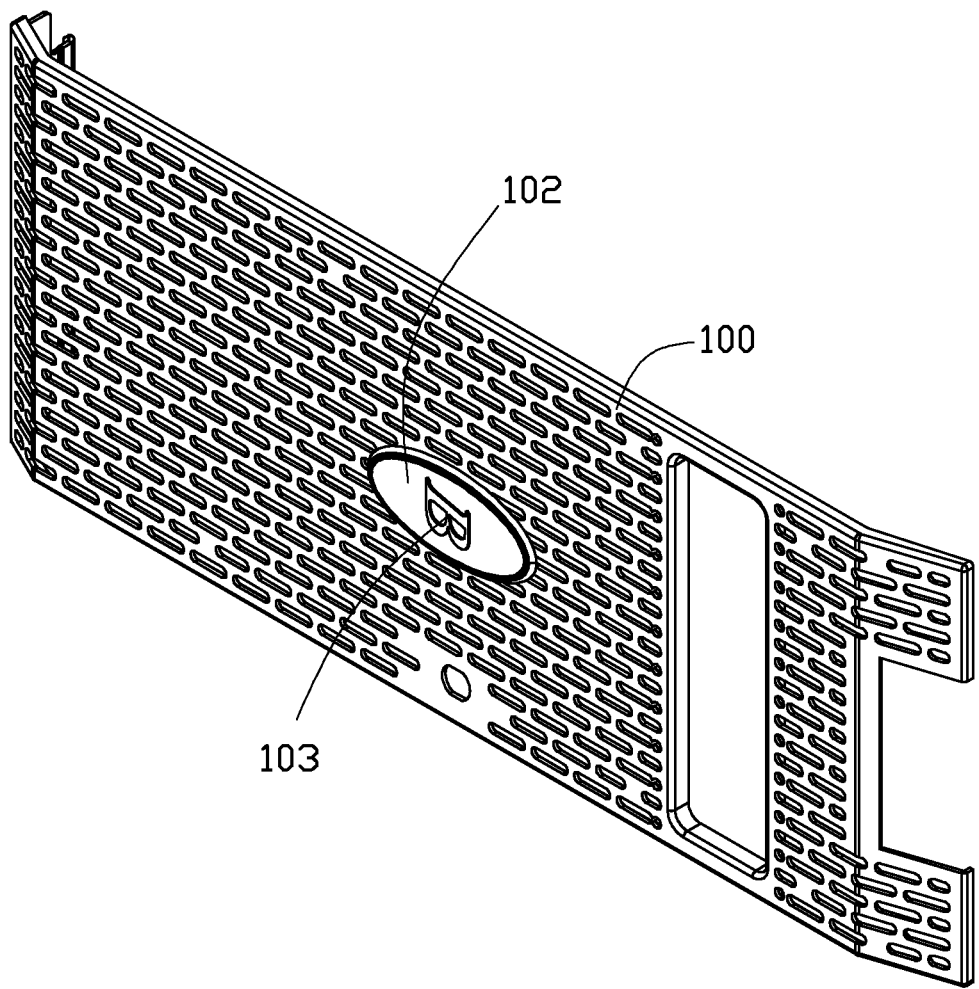
FIG. 6 is a schematic view of a front panel of a related art.

Referring to FIG. 5, when the front panel 10 is rotated to be laid on its side, the identification plate 30 is rotated to move the locking portion 363 of the cam 36 away from the first extension area 1141 to the transition area 1143 overcoming blocking of the first blocking bulge 1112. With the identification plate 30 rotating on, the locking portion 363 of the cam 36 moves through the transition area 1143 to be fitted in the second extension area 1142 to make the logo 310 upright on the front panel 10. The second blocking bulge 1113 abuts the locking portion 363 to prevent the locking portion 363 from inadvertently moving away from the second extension area 1142.

It is to be understood, however, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A front panel assembly, comprising:
a front panel defining at least one arc-shaped slot, and a through hole, the through hole comprising a positioning area concentric with the slot, and a first extension area, a transition area, and a second extension area, all extending from the positioning area, wherein the transition area is arranged between and communicates with the first and second extension areas; and an identification plate comprising:
a main body marked with a logo on a front side of the main body;
at least one engagement tab protruding from a back side of the main body and slidably engaging in the at least one slot of the front panel; and
a cam protruding from the back side of the main body, and comprising a rotation portion rotatably received in the positioning area of the through hole of the front panel, and a locking portion extending from a side of the rotation portion and movable within the through hole between the first extension area, the second extension area, and the transition area of the through hole with the identification plate rotating relative to the front panel.

2. The front panel assembly of claim 1, wherein a first blocking bulge and a second blocking bulge protrude from an inner wall bounding the through hole, the first blocking bulge is arranged at a joint of the first extension area and the transition area to abut the locking portion of the cam in response to the locking portion being received in the first extension area, the second blocking bulge is arranged at a joint of the second extension area and the transition area to abut the locking portion of the cam in response to the locking portion being received in the second extension area.

3. The front panel assembly of claim 1, wherein the first and the second extension areas extend from the positioning area of the through hole along perpendicular directions.

4. The front panel assembly of claim 1, wherein the engagement tab comprises a resilient piece depending upon the main body, and a wedge-shaped tooth protruding from an outside of the resilient piece and adjacent to a distal end of the resilient piece.

5. The front panel assembly of claim 1, wherein the front panel defines a recess to accommodate the identification plate, the at least one slot and the through hole are defined in a bottom wall of the recess.

* * * * *